United States Patent
Kim et al.

(10) Patent No.: US 11,494,033 B2
(45) Date of Patent: Nov. 8, 2022

(54) METHOD OF DETECTING TOUCH LOCATION AND DISPLAY APPARATUS

(71) Applicant: Samsung Display Co., Ltd., Yongin-si (KR)

(72) Inventors: Soowon Kim, Yongin-si (KR); Yerin Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/444,905

(22) Filed: Aug. 11, 2021

(65) Prior Publication Data

US 2022/0137786 A1    May 5, 2022

(30) Foreign Application Priority Data

Nov. 4, 2020 (KR) .................. 10-2020-0146276

(51) Int. Cl.
*G06F 3/041* (2006.01)
*G06F 3/044* (2006.01)

(52) U.S. Cl.
CPC ........ *G06F 3/04186* (2019.05); *G06F 3/0412* (2013.01); *G06F 3/0446* (2019.05); *G06F 3/04182* (2019.05)

(58) Field of Classification Search
CPC .. G06F 3/0446; G06F 3/0412; G06F 3/04182; G06F 3/0443; G06F 3/04164; G06F 3/04186; G06F 2203/04111; G06F 2203/04112
USPC ........................................................ 345/173
See application file for complete search history.

(56) References Cited

U.S. PATENT DOCUMENTS

| | | | |
|---|---|---|---|
| 8,766,943 | B2 | 7/2014 | Hwang et al. |
| 8,988,360 | B2 | 3/2015 | Takahashi et al. |
| 10,705,635 | B2 | 7/2020 | Kim et al. |
| 2013/0057493 | A1* | 3/2013 | Hwang ................. G06F 3/0418 345/173 |

FOREIGN PATENT DOCUMENTS

| | | | |
|---|---|---|---|
| CN | 109725776 A | * 5/2019 | ............ G06F 3/041 |
| KR | 10-1395991 B1 | 5/2014 | |
| KR | 10-1519980 B1 | 5/2015 | |
| KR | 10-2016-0017378 A | 2/2016 | |
| KR | 10-2018-0127705 A | 11/2018 | |
| KR | 10-2019-0038707 A | 4/2019 | |
| KR | 10-2020-0042664 A | 4/2020 | |

OTHER PUBLICATIONS

English Translation CN 109725776 A, 2022, pp. 1-12 (Year: 2022).*

* cited by examiner

*Primary Examiner* — Jimmy H Nguyen
(74) *Attorney, Agent, or Firm* — Lewis Roca Rothgerber Christie LLP

(57) ABSTRACT

A display apparatus includes: a substrate having a first display area and a second display area; and a touch driving circuit configured to: receive first sensing signals of first touch sensors on the first display area; receive second sensing signals of second touch sensors on the second display area; generate first touch values based on the first sensing signals; generate second touch values based on the second sensing signals; generate corrected touch values by correcting the second touch values; and determine a touch location based on the first touch values and the corrected touch values.

20 Claims, 11 Drawing Sheets

METHOD OF DETECTING TOUCH LOCATION AND DISPLAY APPARATUS

CROSS-REFERENCE TO RELATED APPLICATION

The present application claims priority to and the benefit of Korean Patent Application No. 10-2020-0146276, filed on Nov. 4, 2020, in the Korean Intellectual Property Office, the entire content of which is hereby incorporated by reference.

BACKGROUND

1. Field

Aspects of some embodiments of the present disclosure relates to a method of detecting a touch location and a display apparatus.

2. Description of Related Art

Recently, the range of uses of display apparatuses has become more diversified. In addition, display apparatuses have become thinner and lighter, and thus, the range of uses for display apparatuses has expanded.

As the area occupied by a display area in display apparatuses has increased, various functions connected to or associated with display apparatuses have been added. As a method of adding various functions while expanding the display area, studies have been continually conducted on display apparatuses having, inside the display area, an area in which various functions other than displaying images are added.

The above information disclosed in this Background section is only for enhancement of understanding of the background and therefore the information discussed in this Background section does not necessarily constitute prior art.

SUMMARY

Aspects of some embodiments include a display apparatus and a method of detecting a touch location, for reducing an error of the touch location that is determined when a touch event occurs in an area in which an optical device is arranged. Aspects of some embodiments include a display apparatus and a method of detecting a touch location, whereby the touch location may be determined based on a corrected value generated by correcting a signal value transmitted when a touch event occurs in an area in which an optical device is arranged. However, these characteristics are examples and do not limit the scope of embodiments according to the present disclosure.

Additional aspects and characteristics will be set forth in part in the description which follows and, in part, will be apparent from the description, or may be learned by practice of the presented embodiments of the disclosure.

Aspects of one or more embodiments include a display apparatus including a substrate in which a first display area and a second display area are defined, and a touch driving circuit configured to receive first sensing signals of first touch sensors on the first display area, receive second sensing signals of second touch sensors on the second display area, generate first touch values based on the first sensing signals, generate second touch values based on the second sensing signals, generate corrected touch values by correcting the second touch values, and determine a touch location based on the first touch values and the corrected touch values.

According to some embodiments, the corrected touch values may be generated by multiplying each of the second touch values by each of correction coefficients.

According to some embodiments, the correction coefficients may be determined as a ratio of a first reference touch value to second reference touch values, the first reference touch value may be determined based on the first touch values when a reference touch input is applied to the first touch sensors, and the second reference touch values may correspond to the second touch values when the reference touch input is applied to the second touch sensors.

According to some embodiments, the second reference touch values may be less than the first reference touch value.

According to some embodiments, the touch driving circuit may further be configured to store the correction coefficients which vary according to locations of the second touch sensors.

According to some embodiments, the first touch sensors may include a first touch capacitor having a first capacitance, and the second touch sensors may include a second touch capacitor having a second capacitance that is less than the first capacitance.

According to some embodiments, the touch driving circuit may further be configured to generate first sensing values by performing analog-to-digital conversion on the first sensing signals and generate the first touch values based on the first sensing values, and generate second sensing values by performing analog-to-digital conversion on the second sensing signals and generate the second touch values based on the second sensing values.

According to some embodiments, the first sensing values may include a signal component and a noise component of the first sensing signals, the second sensing values may include a signal component and a noise component of the second sensing signals, and the touch driving circuit may further be configured to generate the first touch values corresponding to the signal component of the first sensing signals and the second touch values corresponding to the signal component of the second sensing signals by applying a noise filter to the first sensing values and the second sensing values.

According to some embodiments, the touch driving circuit may further be configured to generate first signal values corresponding to a signal component of the first sensing signals and second signal values corresponding to a signal component of the second sensing signals by applying a noise filter to the first sensing values and the second sensing values, generate first noise values corresponding to a noise component of the first sensing signals and second noise values corresponding to a noise component of the second sensing signals by applying a noise extraction filter to the first sensing values and the second sensing values, generate the first touch values based on a ratio of the first signal values to the first noise values, and generate the second touch values based on a ratio of the second signal values to the second noise values.

According to some embodiments, the first touch values may correspond to a signal component of the first sensing signals, and the second touch values may correspond to a signal component of the second sensing signals.

According to some embodiments, the first touch values may correspond to a signal-to-noise ratio of the first sensing signals, and the second touch values may correspond to a signal-to-noise ratio of the second sensing signals.

According to some embodiments, the display apparatus may further include a plurality of first sensing electrode lines each extending on the substrate in a first direction and a plurality of second sensing electrode lines each extending on the substrate in a second direction. Each of the first and second touch sensors may correspond to a region in which the plurality of first sensing electrode lines and the plurality of second sensing electrode lines cross each other.

According to some embodiments, the display apparatus may further include a plurality of first pixels arranged on the first display area and a plurality of second pixels arranged on the second display area. A number of the first pixels per unit area may be greater than a number of the second pixels per unit area.

According to some embodiments, the second display area may include a plurality of transmission areas, and the display apparatus may further include an optical device configured to emit light through the plurality of transmission areas or receive light through the plurality of transmission areas.

According to some embodiments, the touch driving circuit may further be configured to determine, by using a centroid method, the touch location, based on the first touch values, location values of the first touch sensors, the corrected touch values, and location values of the second touch sensors, wherein the location values of the first touch sensors respectively correspond to the first touch values, and the location values of the second touch sensors respectively correspond to the corrected touch values.

Aspects of one or more embodiments include a method of detecting a touch location, the method including receiving first sensing signals from first touch sensors arranged on a first display area of a substrate and receiving second sensing signals from second touch sensors arranged on a second display area of the substrate, generating first touch values based on the first sensing signals and generating second touch values based on the second sensing signals, generating corrected touch values by correcting the second touch values, and determining the touch location based on the first touch values and the corrected touch values.

According to some embodiments, the generating of the corrected touch values may include generating the corrected touch values by multiplying each of the second touch values by each of correction coefficients. The correction coefficients may be determined as a ratio of a first reference touch value to second reference touch values, the first reference touch value may be determined based on the first touch values when a reference touch input is applied to the first touch sensors, and the second reference touch values may correspond to the second touch values when the reference touch input is applied to the second touch sensors.

According to some embodiments, the generating of the first and second touch values may include generating first sensing values by performing analog-to-digital conversion on the first sensing signals and generating second sensing values by performing analog-to-digital conversion on the second sensing signals and generating the first touch values corresponding to a signal component of the first sensing signals and the second touch values corresponding to a signal component of the second sensing signals by applying a noise filter to the first sensing values and the second sensing values.

According to some embodiments, the generating of the first and second touch values may include generating first sensing values by performing analog-to-digital conversion on the first sensing signals and generating second sensing values by performing analog-to-digital conversion on the second sensing signals, generating first signal values corresponding to a signal component of the first sensing signals and second signal values corresponding to a signal component of the second sensing signals by applying a noise filter to the first sensing values and the second sensing values, generating first noise values corresponding to a noise component of the first sensing signals and second noise values corresponding to a noise component of the second sensing signals by applying a noise extraction filter to the first sensing values and the second sensing values, and generating the first touch values based on a ratio of the first signal values to the first noise values and generating the second touch values based on a ratio of the second signal values to the second noise values.

According to some embodiments, the determining of the touch location may include determining, by using a centroid method, the touch location, based on the first touch values, location values of the first touch sensors, the corrected touch values, and location values of the second touch sensors, wherein the location values of the first touch sensors respectively correspond to the first touch values, and the location values of the second touch sensors respectively correspond to the corrected touch values.

These general and specific embodiments may be implemented by using a system, a method, a computer program, or a combination of the system, the method, and the computer program.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
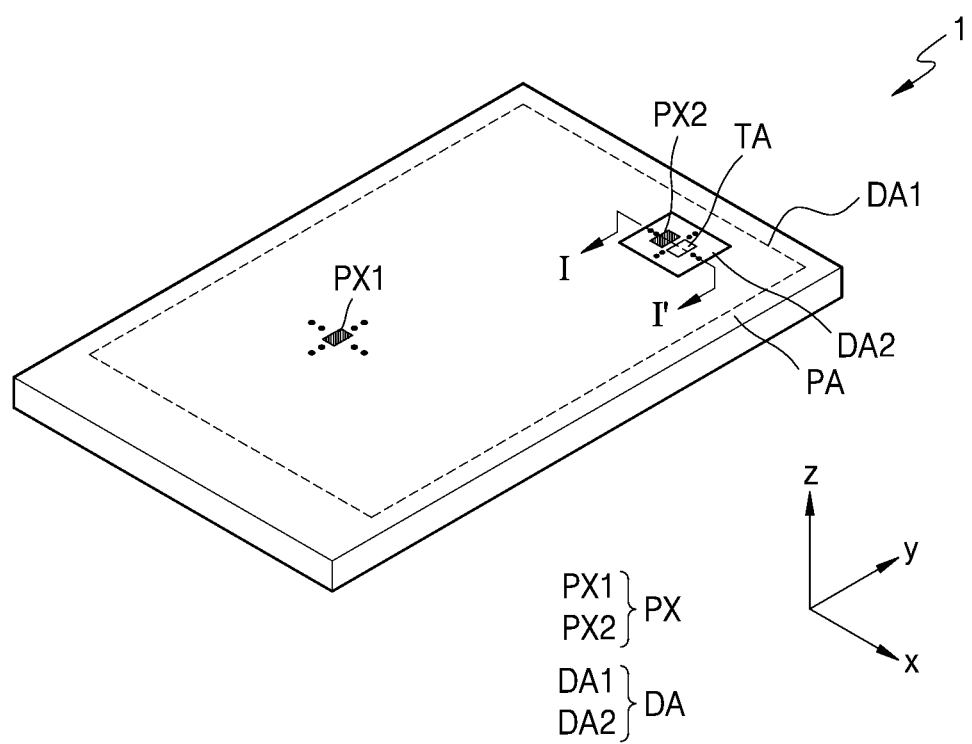
FIG. 1 is a schematic perspective view of a display apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in more detail. Effects and characteristics of the disclosure, and realizing methods thereof will become apparent by referring to the drawings and embodiments described in more detail below. However, the disclosure is not limited to the embodiments disclosed hereinafter and may be realized in various forms.

Hereinafter, embodiments of the disclosure will be described in more detail by referring to the accompanying drawings. In descriptions with reference to the drawings, the same reference numerals are given to components that are the same or substantially the same and descriptions will not be repeated.

It will be understood that although the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In this specification, the expression "A and/or B" may indicate A, B, or A and B. Also, the expression "at least one of A and B" may indicate A, B, or A and B.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus 1 according to some embodiments.

Referring to FIG. 1, the display apparatus 1 may include a display area DA configured to emitting light (or display images) and a peripheral area PA not configured to emit light. The peripheral area PA may be arranged outside the display area DA. For example, the peripheral area PA may be a bezel area.

The display area DA may include a first display area DA1 and a second display area DA2. The second display area DA2 may be arranged to be adjacent to the first display area DA1. For example, as illustrated in FIG. 1, the first display area DA1 may be arranged outside the second display area DA2.

According to some embodiments, FIG. 1 illustrates that one second display area DA2 is arranged inside the first display area DA1. According to some embodiments, there may be at least two second display areas DA2, and the second display areas DA2 may have different shapes and sizes from each other. The peripheral area PA may be a non-display area in which pixels are not arranged. The first display area DA1 may be entirely or partially surrounded by the peripheral area PA.

FIG. 1 illustrates that the second display area DA2 has approximately a square shape. However, embodiments according to the present disclosure are not limited thereto. When viewed in a plan view (or in a direction perpendicular or normal with respect to a surface of a substrate), a shape of the second display area DA2 may vary, and may be a circular shape, an oval shape, polygonal shapes such as a square shape, a stellate shape, a diamond shape, etc.

Also, FIG. 1 illustrates that the second display area DA2 is arranged on a side (an upper right side) of the first display area DA1 having a square shape. However, the disclosure is not limited thereto. According to some embodiments, the second display area DA2 may be arranged on a side (for example, an upper left side or an upper central side) of the first display area DA1 having a square shape.

In addition, FIG. 1 illustrates that the second display area DA2 is entirely surrounded by the first display area DA1. However, the disclosure is not limited thereto. According to some embodiments, the second display area DA2 may be partially surrounded by the first display area DA1, and a side surface of the second display area DA2, which is not surrounded by the first display area DA1, may be surrounded by the peripheral area PA.

Hereinafter, as the display apparatus 1 according to some embodiments of the disclosure, the display apparatus 1 is described as including an organic light-emitting display panel. However, the display apparatus 1 according to the disclosure is not limited thereto. According to some embodiments, the display apparatus 1 may include a display panel, such as an inorganic light-emitting display panel or a quantum dot light-emitting display panel. For example, an emission layer of a display element included in a display panel 10 may include an organic material, an inorganic material, a quantum dot, an organic material and a quantum dot, or an inorganic material and a quantum dot.

The display apparatus 1 may display images (e.g., set or predetermined images, or images defined by image data received by the display apparatus 1 (e.g., from an external source)) by using light emitted from a plurality of pixels PX arranged in the first display area DA1 and the second display area DA2. A first pixel array, in which first pixels PX1 are two-dimensionally arranged, may be located in the first display area DA1, and a second pixel array, in which second pixels PX2 are two-dimensionally arranged, may be located in at least a portion of the second display area DA2. The first pixels PX1 may be arranged in remaining portions of the second display area DA2, except for the portion in which the second pixels PX2 are arranged.

The display apparatus 1 may provide a first image (or a main image) by using light emitted from the plurality of first pixels PX1 arranged in the first display area DA1 and may provide a second image (or an auxiliary image) by using light emitted from the plurality of second pixels PX2 arranged in the second display area DA2. The first image and the second image may be portions of an image or may each be an independent image. The second image provided by the second display area DA2 may have a lower resolution than the first image provided by the first display area DA1.

The display apparatus 1 may include an optical device located in the second display area DA2, and for driving the optical device, the second display area DA2 may include a transmission area TA.

Figure 2:
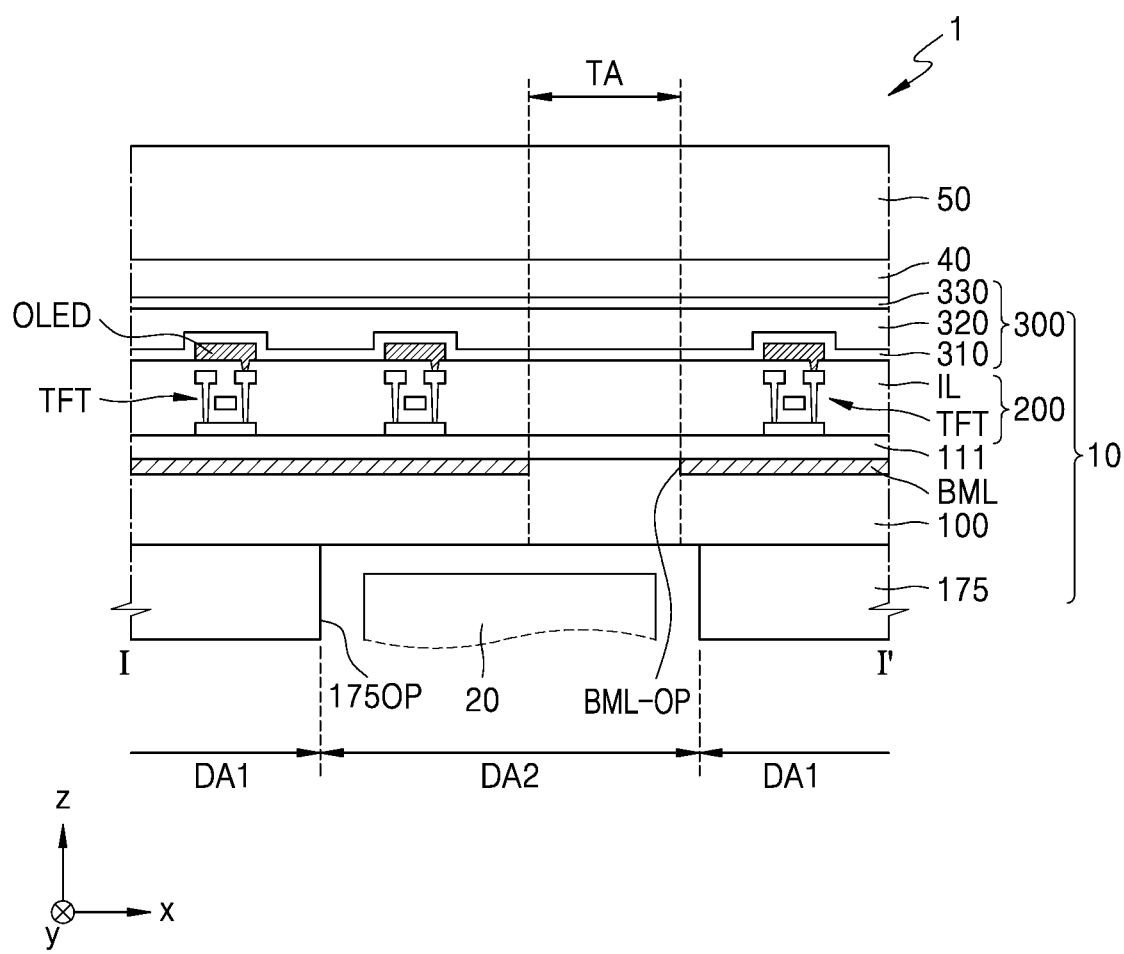
FIG. 2 is an example cross-sectional view of a display area of FIG. 1, taken along the line I-I' of FIG. 1.

FIG. 2 is an example cross-sectional view of the display area DA of FIG. 1, taken along the line I-I' of FIG. 1.

Referring to FIG. 2, the display apparatus 1 may include the display panel 10 and an optical device 20 arranged to overlap the display panel 10.

The display panel 10 may include a substrate 100, a display layer 200 arranged on the substrate 100, a thin-film encapsulation layer 300 on the display layer 200, a touch sensing layer 40, an optical functional layer 50, and a light-shielding layer BML.

The substrate 100 may include glass or polymer resins. The polymer resins may include polyether sulfone, polyacrylate, polyether imide, polyethylene naphthalate, polyethylene terephthalate (PET), polyphenylene sulfide, polyarylate, polyimide (PI), polycarbonate, cellulose acetate propionate, or the like. The substrate 100 including the polymer resins may be flexible, rollable, or bendable. The substrate 100 may have a multi-layered structure including a layer including the polymer resins described above and an inorganic layer.

The display layer 200 may be arranged on a first surface (for example, a +z direction) of the substrate 100, and a lower protection film 175 may be arranged on a second surface (for example, a −z direction) that is the opposite to the first surface of the substrate 100. The lower protection film 175 may be coupled on the second surface of the substrate 100. An adhesive layer may be arranged between the lower protection film 175 and the substrate 100. Alternatively, the lower protection film 175 may be directly formed on the second surface of the substrate 100, and according to some embodiments, the adhesive layer may not be arranged between the lower protection film 175 and the substrate 100.

The lower protection film 175 may support and protect the substrate 100. The lower protection film 175 may have an opening 175OP corresponding to the second display area DA2. Because the lower protection film 175 has the opening 175OP, the transmittance of the second display area DA2, for example, the light transmittance of the transmission area TA, may be improved. The lower protection film 175 may include PET or PI.

The display layer 200 may include a circuit layer including a thin-film transistor TFT, a display element layer including a display element, that is, an organic light-emitting diode OLED, and an insulating layer IL. The thin-film transistor TFT and the organic light-emitting diode OLED electrically connected to the thin-film transistor TFT may be arranged in each of the first display area DA1 and the second display area DA2. The second display area DA2 may include the transmission area TA, in which the thin-film transistor TFT and the organic light-emitting diode OLED are not arranged.

The transmission area TA may be an area through which light that is output from the optical device 20 and/or light that is incident toward the optical device 20 may be transmitted. The transmittance of the transmission area TA may be equal to or greater than about 50%, about 60%, about 75%, about 80%, about 85%, or about 90%.

The thin-film encapsulation layer 300 may include at least one inorganic encapsulation layer and at least one organic encapsulation layer. According to some embodiments, the thin-film encapsulation layer 300 may include a first inorganic encapsulation layer 310, a second inorganic encapsulation layer 330, and an organic encapsulation layer 320 therebetween.

The touch sensing layer 40 may obtain coordinate information according to an external input, for example, a touch event. The touch sensing layer 40 may include a sensing electrode and signal lines connected to the sensing electrode. The touch sensing layer 40 may sense the external input by using a mutual cap method or a self-cap method.

The touch sensing layer 40 may be formed on the thin-film encapsulation layer 300. Alternatively, the touch sensing layer 40 may be separately formed, and then, the touch sensing layer 40 may be coupled on the thin-film encapsulation layer 300 via an adhesive layer, such as an optical clear adhesive (OCA). According to some embodiments, as illustrated in FIG. 2, the touch sensing layer 40 may be directly formed on the thin-film encapsulation layer 300. In this case, an adhesive layer may not be arranged between the touch sensing layer 40 and the thin-film encapsulation layer 300.

The optical functional layer 50 may be formed on the touch sensing layer 40. The optical functional layer 50 may include a reflection prevention layer. The reflection prevention layer may reduce the reflectivity of light that is incident toward the display panel 10 from the outside.

The light-shielding layer BML may be arranged between the substrate 100 and the display layer 200. For example, the light-shielding layer BML may be arranged, for example, between the thin-film transistor TFT and the substrate 100.

The light-shielding layer BML may include an opening BML-OP corresponding to the transmission area TA. The light-shielding layer BML may define the opening BML-OP described above. The light-shielding layer BML may include a light-shielding material (for example, metal, black ink, or the like). The light-shielding layer BML may be arranged to cover the first display area DA1 and a portion of the second display area DA2. A portion of the light-shielding layer BML, the portion covering the first display area DA1, and a portion of the light-shielding layer BML, the portion covering the portion of the second display area DA2, may be connected as one body. For example, the light-shielding layer BML may be arranged to correspond to the first display area DA1 of the display panel 10, and the entire area of the second display area DA2 excluding the transmission area TA.

The light-shielding layer BML may be arranged on the substrate 100 as illustrated in FIG. 2. Alternatively, the light-shielding layer BML may be arranged between layers of the multi-layered structure of the substrate 100. For example, the light-shielding layer BML may be arranged between a plurality of sub-layers included in the substrate 100. The light-shielding layer BML may not be an essential component of the disclosure and may be omitted according to cases.

The optical device 20 may be located to correspond to the second display area DA2. The optical device 20 may emit light through the transmission area TA or receive light through the transmission area TA.

The optical device 20 may include an electronic element using light or sound. For example, the electronic element may include a sensor configured to measure a distance, such as a proximity sensor, a sensor configured to recognize a part (for example, a fingerprint, an iris, a face, etc.) of a body of a user, a small lamp configured to output light, an image sensor (for example, a camera) configured to capture an image, and the like. The electronic element using light may use light of various wavelength bands, such as visible rays, infrared rays, ultraviolet rays, etc. The electronic element using sound may use ultrasonic sound waves or sound of other frequency bands.

One optical device 20 or a plurality of optical devices 20 may be arranged in the second display area DA2. In some embodiments, the optical device 20 may include a light emitter and a light receiver. The light emitter and the light receiver may be integrated as one body or may be physically separated such that a pair of a light emitter and a light receiver may form one optical device 20.

Figure 3:
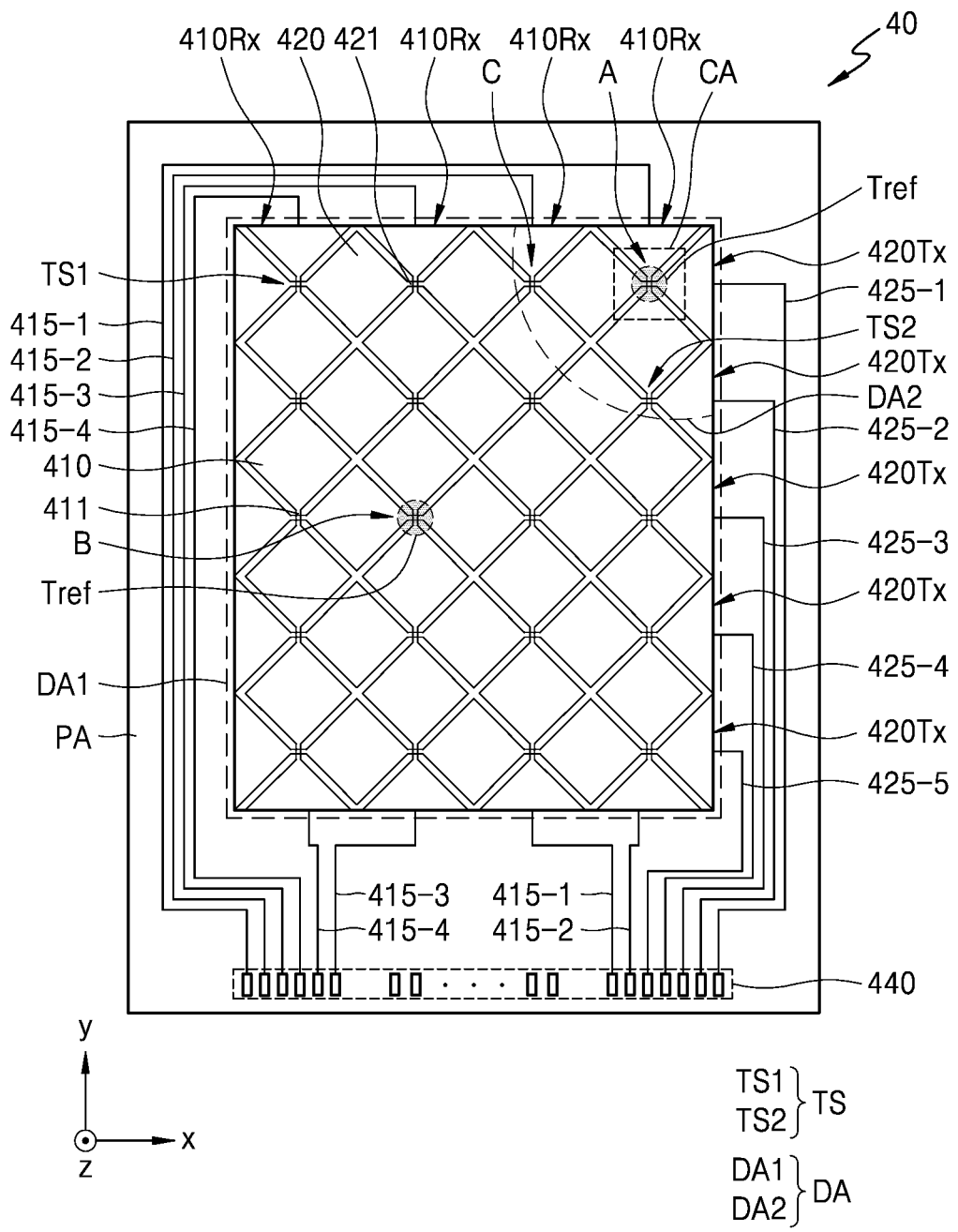
FIG. 3 is a schematic plan view of a touch sensing layer included in a display apparatus according to some embodiments.

FIG. 3 is a schematic plan view of the touch sensing layer 40 included in the display apparatus 1 according to some embodiments.

Referring to FIG. 3, the touch sensing layer 40 may include a plurality of first sensing electrode lines 410Rx, first signal lines 415-1 through 415-4 connected to the plurality of first sensing electrode lines 410Rx, a plurality of second sensing electrode lines 420Tx, and second signal lines 425-1 through 425-5 connected to the plurality of second sensing electrode lines 420Tx.

The plurality of first sensing electrode lines 410Rx and the plurality of second sensing electrode lines 420Tx may be arranged in the display area DA, and the first signal lines 415-1 through 415-4 and the second signal lines 425-1 through 425-5 may be arranged in the peripheral area PA.

The plurality of first sensing electrode liens 410Rx may include a plurality of first sensing electrodes 410 and a plurality of first connection electrodes 411. The plurality of first connection electrodes 411 may be located between the plurality of first sensing electrodes 410. The plurality of first sensing electrodes 410 that are adjacent to each other may be connected to each other through the plurality of first connection electrodes 411.

The plurality of first sensing electrode lines 410Rx may extend in a first direction (for example, a ±y direction). The plurality of first sensing electrodes 410 included in the plurality of first sensing electrode lines 410Rx, respectively, may be arranged in the first direction (for example, the ±y direction).

The plurality of second sensing electrode lines 420Tx may include a plurality of second sensing electrodes 420 and a plurality of second connection electrodes 421. The plurality of second connection electrodes 421 may be located between the plurality of second sensing electrodes 420. The plurality of second sensing electrodes 420 that are adjacent to each other may be connected to each other through the plurality of second connection electrodes 421.

The plurality of second sensing electrode lines 420Tx may extend in a second direction (for example, a ±x direction) crossing the first direction (for example, the ±y direction). The plurality of second sensing electrodes 420 included in the plurality of second sensing electrode lines 420Tx, respectively, may be arranged in the second direction (for example, the ±x direction).

The plurality of first sensing electrode lines 410Rx and the plurality of second sensing electrode lines 420Tx may cross each other. For example, the plurality of first sensing electrode lines 410Rx and the plurality of second sensing electrode lines 420Tx may cross each other in a perpendicular direction.

Touch sensors TS may be located in regions in which the plurality of first sensing electrode lines 410Rx and the plurality of second sensing electrode lines 420Tx cross each other. The touch sensors TS may include first touch sensors TS1 located in the first display area DA1 and second touch sensors TS2 located in the second display area DA2. The touch sensors TS will be described in more detail with reference to FIGS. 4A and 4B.

The plurality of first sensing electrode lines 410Rx may be connected to pads of a sensing signal pad portion 440 through the first signal lines 415-1 through 415-4 in the peripheral area PA. For example, the first signal lines 415-1 through 415-4 may be connected to both of an upper portion and a lower portion of the plurality of sensing electrode lines 410Rx respectively, thereby forming a double routing structure. The first signal lines 415-1 through 415-4 connected to the upper portion and the lower portion of the plurality of first sensing electrode lines 410Rx may be connected to the pad corresponding thereto respectively.

The plurality of second sensing electrode lines 420Tx may be connected to pads of the sensing signal pad portion 440 through the second signal lines 425-1 through 425-5 in the peripheral area PA. For example, the second signal lines 425-1 through 425-5 may be connected to the pad corresponding thereto respectively.

FIG. 3 illustrates a double routing structure in which the first signal lines 415-1 through 415-4 is connected to an upper portion and a lower portion of the plurality of first sensing electrode lines 410Rx respectively. This structure may increase the sensing sensitivity. According to some embodiments, the first signal lines 415-1 through 415-4 may have a single routing structure in which the first signal lines 415-1 through 415-4 are connected to an upper portion or a lower portion of the plurality of first sensing electrode lines 410Rx respectively.

Figure 4A:
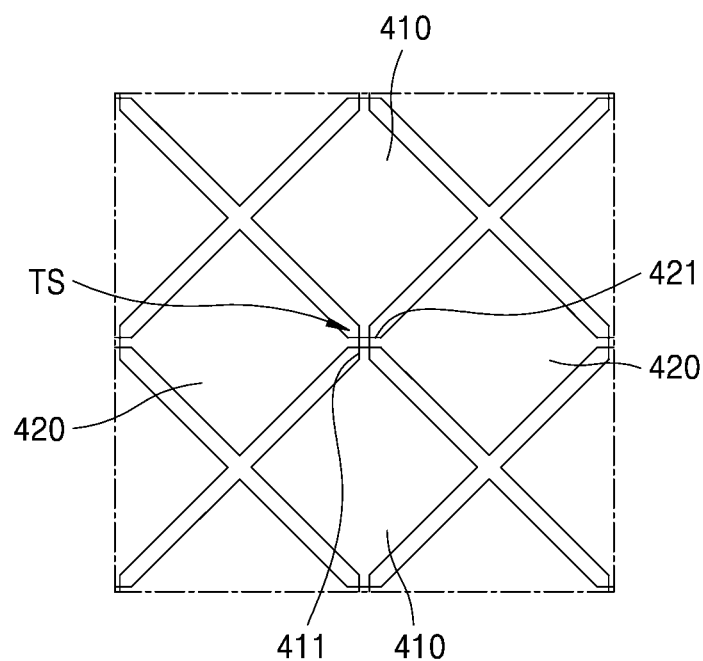
FIG. 4A is an enlarged plan view schematically illustrating a touch sensor included in a display apparatus according to some embodiments.
Figure 4B:
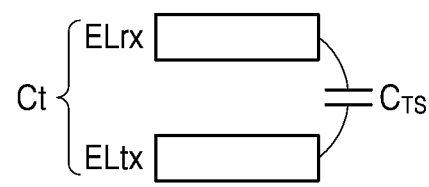
FIG. 4B is a diagram for describing an operation principle of a touch sensor included in a display apparatus according to some embodiments.

FIG. 4A is an enlarged plan view schematically illustrating the touch sensors TS included in the display apparatus 1 according to some embodiments, and FIG. 4B is a diagram for describing an operation principle of the touch sensors TS included in the display apparatus 1 according to some embodiments.

As described with reference to FIG. 3, the touch sensor TS may correspond to a region in which the first sensing electrode line 410Rx and the second sensing electrode line 420Tx cross each other. In other words, as illustrated in FIG. 4A, the touch sensor TS may correspond to a region in which the first connection electrode 411 and the second connection electrode 421 cross each other. The touch sensor TS may correspond to a region in which the first connection electrode 411 and the second connection electrode 421 overlap each other.

Referring to FIG. 4A, each of the first sensing electrodes 410 may be located above or below the touch sensor TS, and each of the second sensing electrodes 420 may be located on the right side or the left side of the touch sensor TS. The touch sensor TS may sense whether or not there is a touch input via the first sensing electrodes 410 and the second sensing electrodes 420 located around the touch sensor TS.

For example, referring to FIG. 4B, the touch sensor TS may include a touch capacitor Ct. The touch capacitor Ct may include a first electrode ELtx and a second electrode ELrx. The first electrode ELtx may correspond to the first sensing electrodes 410 located above or below the touch sensor TS, and the second electrode ELrx may correspond to the second sensing electrodes 420 located on the right side or the left side of the touch sensor TS.

The touch capacitor Ct including the first electrode ELtx and the second electrode ELrx may have a capacitance $C_{TS}$. When there is no touch input in the display apparatus, the capacitance $C_{TS}$ may not be changed, and an initial value of the capacitance $C_{TS}$ may be maintained. When a touch input (for example, a touch of a finger) is applied to the touch sensor TS or a location around the touch sensor TS, a capacitance may be formed between the finger and the first electrode ELtx or the second electrode ELrx, and thus, the capacitance $C_{TS}$ between the first electrode ELtx and the second electrode ELrx may be changed. Like this, when an arbitrary touch input is applied to the display apparatus, the capacitance $C_{TS}$ may be changed, and the touch sensor TS may sense whether or not there is a touch input by using a change of the capacitance $C_{TS}$ between the first electrode ELtx and the second electrode ELrx.

Figure 5:
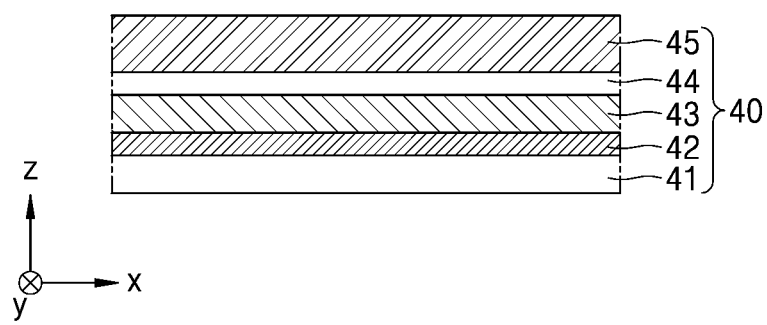
FIG. 5 is a schematic cross-sectional view of a stack structure of a touch sensing layer included in a display apparatus according to some embodiments.

FIG. 5 is a schematic cross-sectional view of a stack structure of the touch sensing layer 40 included in the display apparatus 1 according to some embodiments.

Referring to FIG. 5, the touch sensing layer 40 may include a first conductive layer 42 and a second conductive layer 44. A first insulating layer 41 may be located below the first conductive layer 42. A second insulating layer 43 may be arranged between the first conductive layer 42 and the second conductive layer 44. A third insulating layer 45 may be located on the second conductive layer 44. Each of the first sensing electrodes 410, the first connection electrodes 411, the second sensing electrodes 420, and the second connection electrodes 421 illustrated in FIG. 3 may be included in the first conductive layer 42 or the second conductive layer 44.

The first conductive layer 42 and the second conductive layer 44 may include a metal layer or a transparent conductive layer. The metal layer may include Mo, Mb, Ag, Ti, Cu, Al, or an alloy thereof. The transparent conductive layer may include a transparent conductive oxide, such as indium tin oxide (ITO), indium zinc oxide (IZO), zinc oxide (ZnO), indium tin zinc oxide (ITZO), or the like. In addition, the transparent conductive layer may include a conductive polymer, such as PEDOT, a metal nanowire, graphene, or the like.

The first conductive layer 42 and the second conductive layer 44 may include a single layer or multiple layers. A single first conductive layer 42 and a single second conductive layer 44 may include a metal layer or a transparent conductive layer, wherein the metal layer and the transparent conductive layer include the materials described above. One of the first conductive layer 42 and the second conductive layer 44 may include a single metal layer. The single metal layer may include a Mo layer or an MoMb alloy layer. One of the first conductive layer 42 and the second conductive layer 44 may include multiple metal layers. The multiple metal layers may include, for example, a triple layer of Ti/Al/Ti or a double layer of Mo/Md. Alternatively, the multiple metal layers may include a metal layer and a transparent conductive layer. The first conductive layer 42 and the second conductive layer 44 may have different stack structures from each other or the same stack structure as each other. For example, the first conductive layer 42 may include a metal layer and the second conductive layer 44 may include a transparent conductive layer. Alternatively, the first conductive layer 42 and the second conductive layer 44 may include the same metal layer.

Materials of the first conductive layer 42 and the second conductive layer 44 and the arrangement of the sensing electrodes (410 and 420 of FIG. 3) included in the first conductive layer 42 and the second conductive layer 44 may be determined by taking into account a sensing sensitivity. An RC delay may affect the sensing sensitivity, and the sensing electrodes including the metal layer may have a less resistance than the sensing electrodes including a transparent conductive layer, and thus, the RC value may be reduced, so that the charging time of a capacitor defined between the sensing electrodes may be reduced. The sensing electrodes including the transparent conductive layer may be less visible to a user than the sensing electrodes including the metal layer, and may have an increased input area to increase the capacitance.

Each of the first through third insulating layers 41, 43, and 45 may include an inorganic insulating material or/and an organic insulating layer. The inorganic insulating material may include silicon oxide, silicon nitride, or silicon oxynitride, and the organic insulating material may include a polymer organic material.

One or more of the first and second sensing electrodes 410 and 420 and the first and second connection electrodes 411 and 421 described above with reference to FIG. 3 may be located on the first conductive layer 42 and the others may be located on the second conductive layer 44.

According to some embodiments, the first conductive layer 42 may include the first connection electrodes 411, and the second conductive layer 44 may include the first and second sensing electrodes 410 and 420, and the second connection electrodes 421. According to some embodiments, the first conductive layer 42 may include the first and second sensing electrodes 410 and 420, and the second connection electrodes 421, and the second conductive layer 44 may include the first connection electrodes 411. According to some embodiments, the first conductive layer 42 may include the first sensing electrodes 410 and the first connection electrodes 411, and the second conductive layer 44 may include the second sensing electrodes 420 and the second connection electrodes 421. In this case, the first sensing electrodes 410 and the first connection electrodes 411 may be provided on the same layer and connected as one body. The second sensing electrodes 420 and the second connection electrodes 421 may be provided on the same layer, and thus, an insulating layer between the first conductive layer 42 and the second conductive layer 44 may not include a contact hole.

FIG. 5 illustrates that the touch sensing layer 40 includes the first insulating layer 41, the first conductive layer 42, the second insulating layer 43, the second conductive layer 44, and the third insulating layer 45. However, according to some embodiments, the first insulating layer 41 arranged below the first conductive layer 42 may be omitted.

Figure 6:
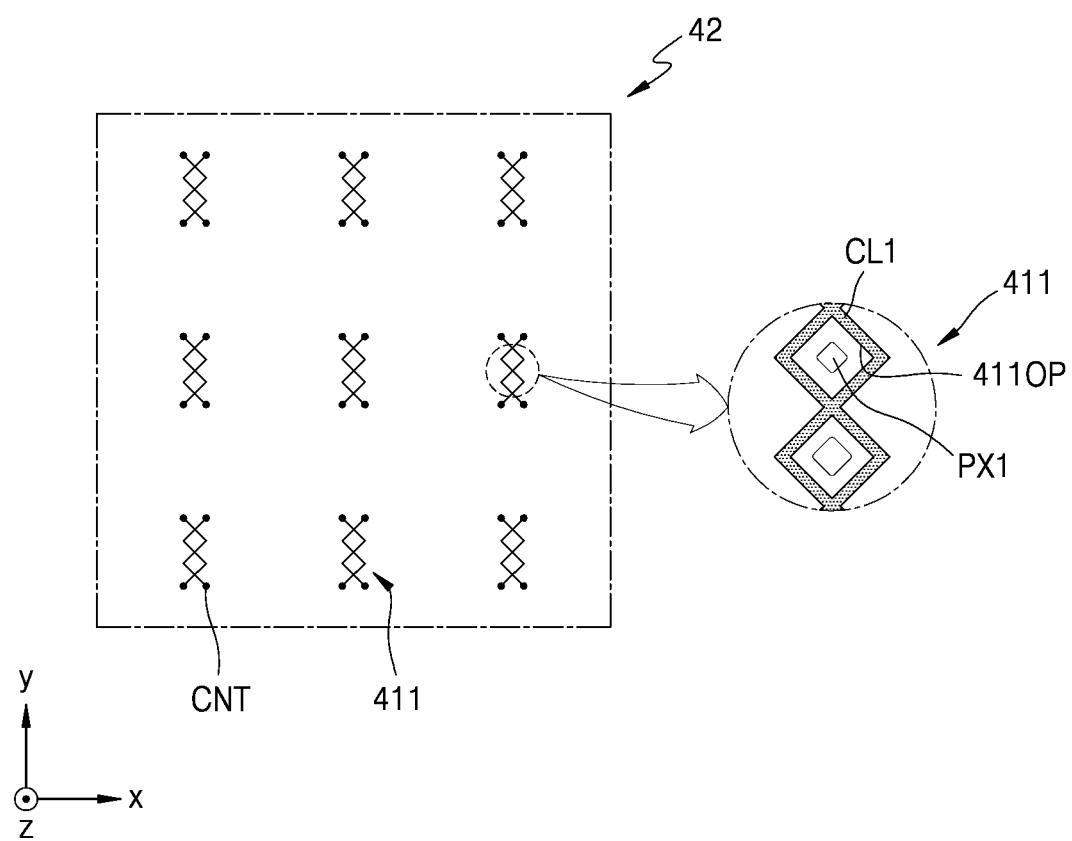
FIG. 6 is a schematic plan view of a first conductive layer of a touch sensing layer included in a display apparatus according to some embodiments.
Figure 7:
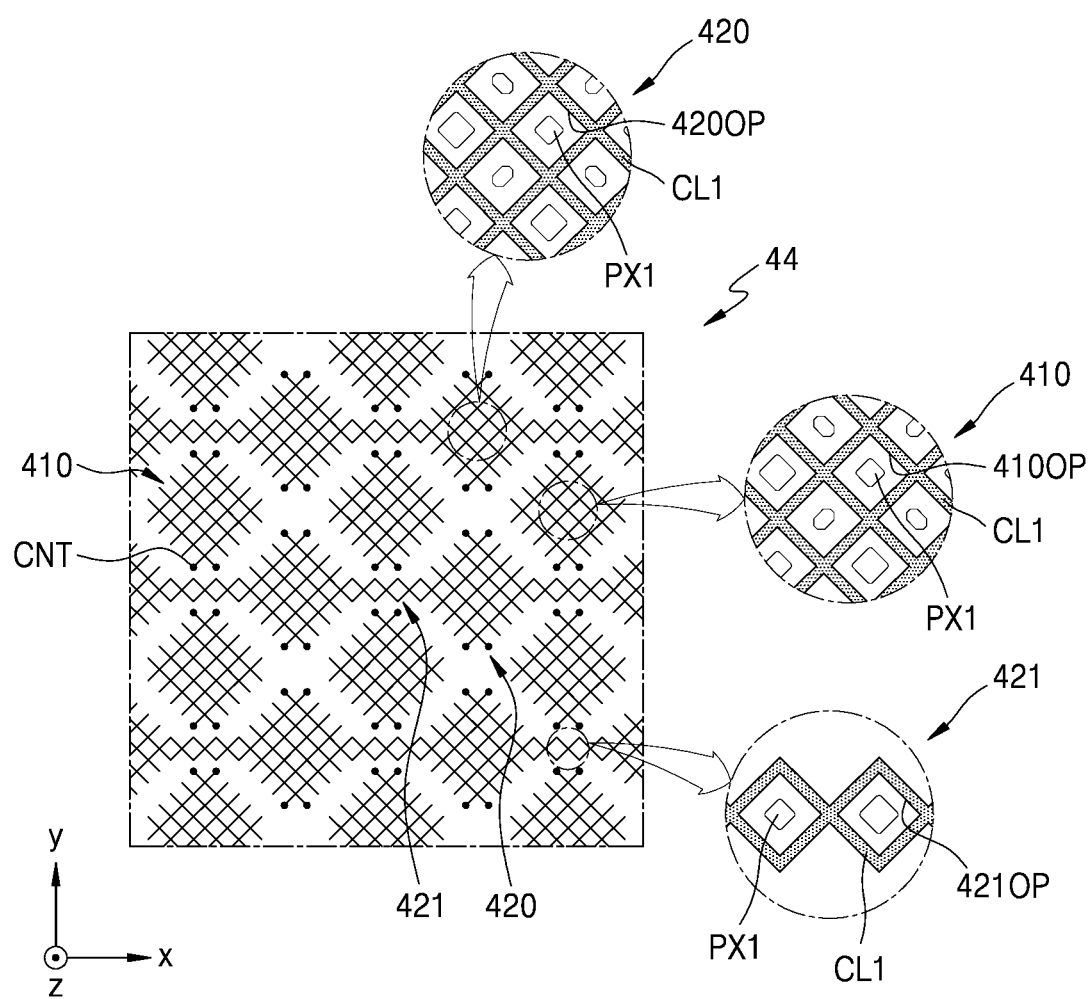
FIG. 7 is a schematic plan view of a second conductive layer of a touch sensing layer included in a display apparatus according to some embodiments.

FIG. 6 is a schematic plan view of the first conductive layer 42 of the touch sensing layer 40 included in the display apparatus 1 according to some embodiments, and FIG. 7 is a schematic plan view of the second conductive layer 44 of the touch sensing layer 40 included in the display apparatus 1 according to some embodiments. FIGS. 6 and 7 respectively illustrate the first conductive layer 42 and the second conductive layer 44 of the touch sensing layer 40, which are located in the first display area DA1.

Referring to FIGS. 6 and 7, the first and second sensing electrodes 410 and 420 and the first and second connection electrodes 411 and 421 may have a mesh (or a grid) pattern. When the first and second sensing electrodes 410 and 420 have a mesh pattern, even when the first and second sensing electrodes 410 and 420 include metal layers, the metal layers may be prevented from being seen by a user. In addition/alternatively, light emitted from each pixel may be transmitted.

Referring to FIG. 6, the first conductive layer 42 of the touch sensing layer 40 may include the first connection electrodes 411. The first connection electrode 411 may include a first conductive line CL1 having a mesh pattern and may include an opening 411OP surrounded by the first conductive line CL1. The opening 411OP may be arranged to overlap the first pixel PX1 of the display panel 10. That is, according to some embodiments, in a plan view or a view perpendicular or normal with respect to a plane of a primary display surface, the first pixel PX1 may be within the opening 411OP.

The first sensing electrodes 411 may be electrically connected with each other through the first connection electrodes 411. The first connection electrode 411 electrically connecting the adjacent first sensing electrodes 410 to each other may be connected with the first sensing electrodes 410 through a contact hole CNT formed in the second insulating layer 43 (FIG. 5).

Referring to FIG. 7, the second conductive layer 44 of the touch sensing layer 40 may include the first sensing electrodes 410, the second sensing electrodes 420, and the second connection electrodes 421. The first sensing electrode 410, the second sensing electrode 420, and the second connection electrode 421 may include the first conductive line CL1 having a mesh pattern and may respectively include openings 410OP, 420OP, and 421OP surrounded by the first conductive line CL1. The openings 410OP, 420OP, and 421OP may be arranged to overlap the first pixel PX1 of the display panel 10.

The second sensing electrodes 420 may be connected to each other via the second connection electrodes 421 formed on the same layer as the second sensing electrodes 420. For example, the second sensing electrodes 420 may include the same material as the second connection electrodes 421 and may be integrally formed as the second connection electrodes 421.

The first sensing electrodes 410 may be electrically connected to each other via the first connection electrodes 411 formed on a different layer from the first sensing electrodes 410. The first sensing electrodes 410 may be connected with the first connection electrodes 411 through the contact hole CNT formed in the second insulating layer 43 (FIG. 5).

Figure 8:
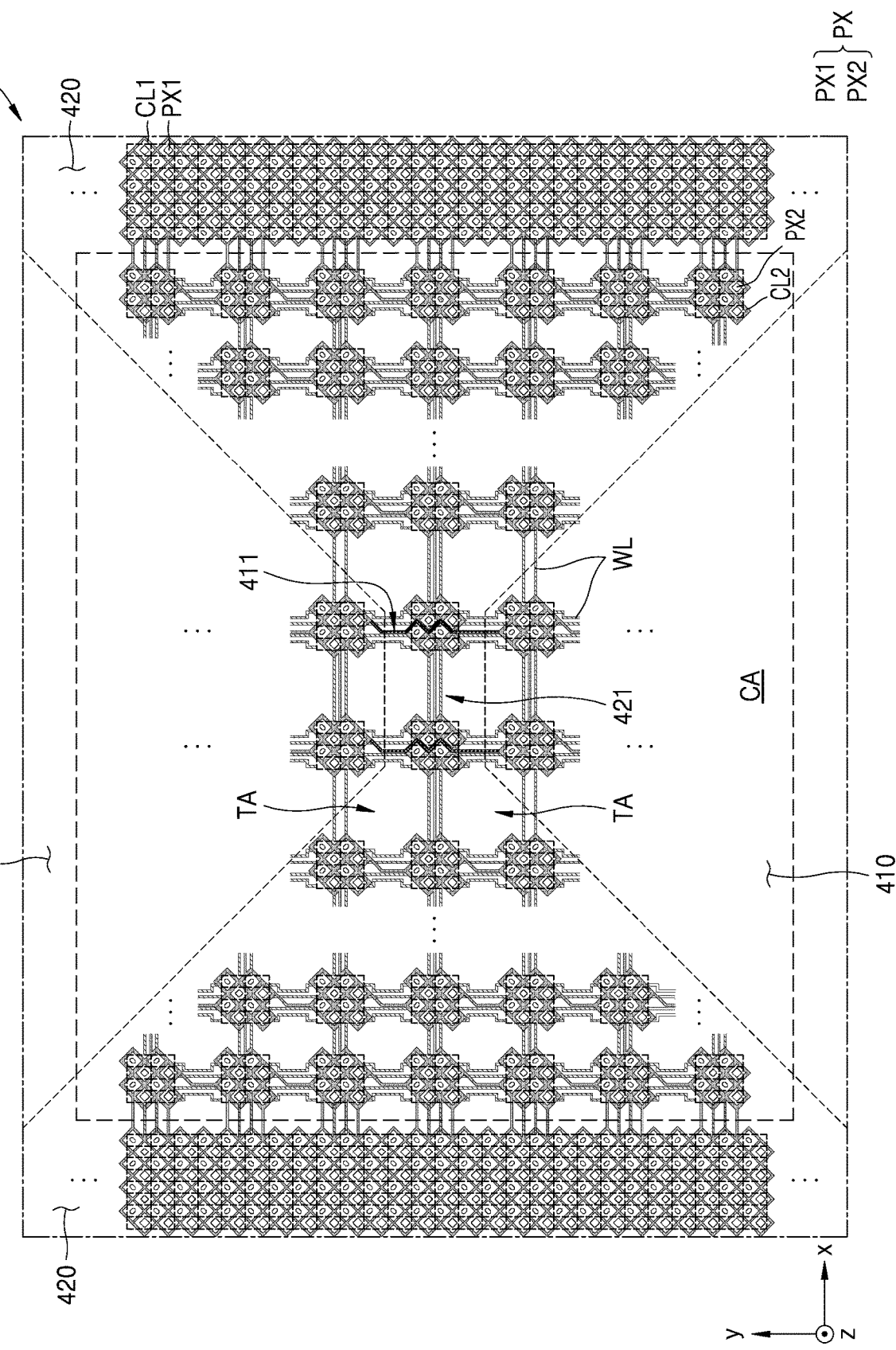
FIG. 8 is an enlarged plan view schematically illustrating a portion of a display apparatus according to some embodiments.

FIG. 8 is an enlarged plan view schematically illustrating a portion of the display apparatus 1 according to some embodiments. For example, FIG. 8 illustrates the touch sensing layer 40 arranged in the second display area DA2 of the display apparatus 1.

Referring to FIG. 8, the second display area DA2 may include the component area CA. A first pixel array in which a plurality of first pixels PX1 are two-dimensionally arranged in a ±x direction and a ±y direction crossing the ±x direction may be located in a portion of the second display area DA2 except for the component area CA. A plurality of second pixels PX2 may be two-dimensionally arranged in the ±x and ±y directions in the component area CA, and the plurality of second pixels PX2 are arranged to be apart from each other with the transmission area TA therebetween, to form a second pixel array. For reference, the first pixel array in which the plurality of first pixels PX1 are two-dimensionally arranged in the ±x direction and the ±y direction crossing the ±x direction may be located in the first display area DA1, as described with reference to FIG. 1.

The number of first pixels PX1 per unit area may be greater than the number of second pixels PX2 per unit area. Because the plurality of first pixels PX1 may be located in the first display area DA1 and the plurality of second pixels PX2 may be located in the component area CA, a first image provided by the first display area DA1 may have a higher resolution than a second image provided by the component area CA. Because the plurality of first pixels PX1 may be located in a portion of the second display area DA2 except the component area CA and the plurality of second pixels PX2 may be located in the component area CA, a third image provided by the portion of the second display area DA2 except the component area CA may have a higher resolution than the second image provided by the component area CA.

The plurality of sensing electrode lines including the first conductive lines CL1 and the second conductive lines CL2 having the mesh patterns may be arranged on the display panel 10 including the plurality of pixels PX, as described above with reference to FIGS. 6 and 7.

The first conductive line CL1 may be arranged to surround an edge of the plurality of first pixels PX1. As described with reference to FIG. 7, the first conductive line CL1 may have a plurality of openings, and the plurality of openings may be arranged to overlap the plurality of first pixels PX1. Likewise, the second conductive line CL2 may be arranged to surround an edge of the plurality of second pixels PX2. The second conductive line CL2 may have a plurality of openings, and the plurality of openings may be arranged to overlap the plurality of second pixels PX2.

As illustrated in FIG. 8, the component area CA may include the transmission area TA, and thus, the plurality of second pixels PX2 may form pixel groups that are apart from each other with the transmission area TA therebetween. As described above, due to the transmission area TA, the number of first pixels PX1 per unit area may be greater than the number of second pixels PX2 per unit area. Thus, an area of the first conductive line CL1 surrounding the edge of the plurality of first pixels PX1 may be greater than an area of the second conductive line CL2 surrounding the edge of the plurality of second pixels PX2.

At least one of the first sensing electrode 410, the second sensing electrode 420, the first connection electrode 411, or the second connection electrode 421 may at least partially overlap the component area CA. According to some embodiments, FIG. 8 illustrates a case in which all of the first sensing electrode 410, the second sensing electrode 420, the first connection electrode 411, and the second connection electrode 421 at least partially overlap the component area CA.

When the first sensing electrode 410 overlaps the component area CA, at least a portion of the first sensing electrode 410 may include the second conductive line CL2. As described above, the area of the second conductive line CL2 may be less than the area of the first conductive line CL1. Thus, the first sensing electrode 410 at least partially including the second conductive line CL2 may have a less metal area than the first sensing electrode 410 not including the second conductive line CL2. A capacitance of the touch sensor TS sensing whether or not there is a touch input through the first sensing electrode 410 at least partially including the second conductive line CL2 may be less than a capacitance of the touch sensor TS sensing whether or not there is a touch input through the first sensing electrode 410 not including the second conductive line CL2. This aspect will be described in more detail with reference to FIG. 9.

Referring to FIG. 8, the first sensing electrodes 410 arranged in the ±y direction and the second sensing electrodes 420 arranged in the ±x direction may be arranged along an outer edge of the component area CA. Also, the first connection electrodes 411 and the second connection electrodes 421 may be arranged in the component area CA.

Lines WL electrically connecting pixel circuits with each other, the pixel circuits being configured to drive the display elements included in the display panel 10, may be arranged in the second display area DA2.

Figure 9:
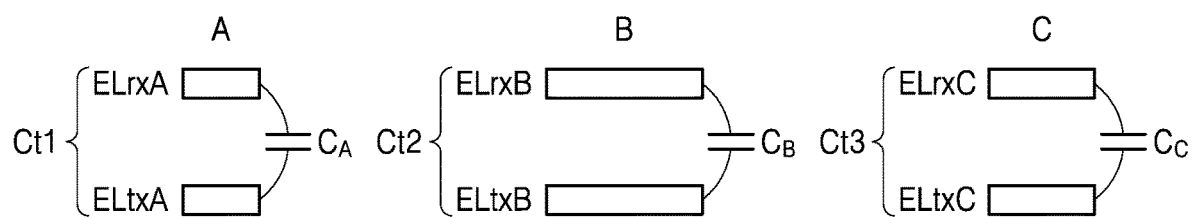
FIG. 9 is a diagram for describing capacitance according to a location of each of touch sensors included in a display apparatus according to some embodiments.

FIG. 9 is a diagram for describing capacitance of the touch sensors TS included in the display apparatus 1 according to a location, according to some embodiments. Descriptions will be given by referring to one or more components illustrated in FIG. 3 together.

Referring to FIG. 3, the first touch sensor TS1 may be located in the first display area DA1, and the second touch sensor TS2 may be located in the second display area DA2. The touch sensor TS in region A may be located in the component area CA in the second display area DA2, the touch sensor TS in region B may be located in the first display area DA1, and the touch sensor TS in region C may be located in the second display area DA2, except the component area CA. FIG. 3 illustrates that one touch sensor TS is located in the component area CA. However, the number of touch sensors may vary.

Referring to FIG. 9, the touch sensor TS in region A may include a first touch capacitor Ct1 having a first capacitance $C_A$, the touch sensor TS in region B may include a second touch capacitor Ct2 having a second capacitance $C_B$, and the touch sensor TS in region C may include a third touch capacitor Ct3 having a third capacitance $C_C$.

According to some embodiments, the first capacitance $C_A$ may be less than the second capacitance $C_B$, and the first capacitance $C_A$ may be less than the third capacitance $C_C$. Also, the third capacitance $C_C$ may be less than the second capacitance $C_B$. The second capacitance $C_B$ of the first capacitance $C_A$, the second capacitance $C_B$, and the third capacitance $C_C$ may have the greatest value.

The first touch capacitor Ct1 may include a first electrode ELtxA and a second electrode ELrxA, the second touch capacitor Ct2 may include a first electrode ELtxB and a second electrode ELrxB, and the third touch capacitor Ct3 may include a first electrode ELtxC and a second electrode ELrxC.

The first electrode ELtxA of the first touch capacitor Ct1 may correspond to the first sensing electrodes 410 each located above or below the touch sensor TS in region A, and the second electrode ELrxA of the first touch capacitor Ct1 may correspond to the second sensing electrodes 420 each located on the right side or the left side of the touch sensor TS in region A. The touch sensor TS in region A may be located in the component area CA, and thus, as described with reference to FIG. 8, the first sensing electrodes 410 each located above or below the touch sensor TS in region A may at least partially include the second conductive line CL2. Thus, a metal area of the first sensing electrodes 410 each located above or below the touch sensor TS in region A may be less than a metal area of the first sensing electrodes 410 located in the first display area DA1. The second sensing electrodes 420 each located on the right side or the left side of the touch sensor TS in region A may at least partially include the second conductive line CL2. Thus, a metal area of the second sensing electrodes 420 each located on the right side or the left side of the touch sensor TS in region A may be less than a metal area of the second sensing electrodes 420 located in the first display area DA1.

The first electrode ELtxB of the second touch capacitor Ct2 may correspond to the first sensing electrodes 410 each located above or below the touch sensor TS in region B, and the second electrode ELrxB of the second touch capacitor Ct2 may correspond to the second sensing electrodes 420 each located on the right side or the left side of the touch sensor TS in region B. The touch sensor TS in region B may be located in the first display area DA1, and thus, the first sensing electrodes 410 each located above or below the touch sensor TS in region B may not include the second conductive line CL2. Thus, a metal area of the first sensing electrodes 410 each located above or below the touch sensor TS in region B may be greater than a metal area of the first sensing electrodes 410 located in the second display area DA2. The second sensing electrodes 420 each located on the right side or the left side of the touch sensor TS in region B may not include the second conductive line CL2. Thus, a metal area of the second sensing electrodes 420 each located on the right side or the left side of the touch sensor TS in region B may be greater than a metal area of the second sensing electrodes 420 located in the second display area DA2.

The first electrode ELtxC of the third touch capacitor Ct3 may correspond to the first sensing electrodes 410 each located above or below the touch sensor TS in region C, and the second electrode ELrxC of the third touch capacitor Ct3 may correspond to the second sensing electrodes 420 each located on the right side or the left side of the touch sensor TS in region C. The touch sensor TS in region C may be located in the second display area DA2 except the component area CA, and thus, one of the first sensing electrodes 410 each located above or below the touch sensor TS in region C may at least partially include the second conductive line CL2. Thus, a metal area of the first sensing electrodes 410 each located above or below the touch sensor TS in region C may be greater than a metal area of the first sensing electrodes 410 located in the component area CA. One of the second sensing electrodes 420 each located on the right side or the left side of the touch sensor TS in region C may at least partially include the second conductive line CL2 or may not include the second conductive line as illustrated in FIG. 3. Thus, a metal area of the second sensing electrodes 420 each located on the right side or the left side of the touch sensor TS in region C may be greater than a metal area of the second sensing electrodes 420 located in the component area CA.

In summary, the first sensing electrodes 410 and the second sensing electrodes used for the touch sensor TS in region A may have the least metal area, and the first sensing electrodes 410 and the second sensing electrodes 420 used for the touch sensor TS in region B may have the greatest metal area. As a result, the first capacitance $C_A$ between the first sensing electrodes 410 and the second sensing electrodes 420 adjacent to the touch sensor TS in region A may be less than the second capacitance $C_B$ between the first sensing electrodes 410 and the second sensing electrodes 420 adjacent to the touch sensor TS in region B.

In this case, as illustrated in FIG. 3, when the same reference touch input Tref is applied to the touch sensor TS in region A and the touch sensor TS in region B, different touch values may be derived. A correction operation may be performed such that when the same reference touch input Tref is applied to the touch sensor TS in region A and the touch sensor TS in region B, the same touch values are derived. A detailed aspect thereof will be described in more detail with reference to FIGS. 10 through 12.

Figure 10:
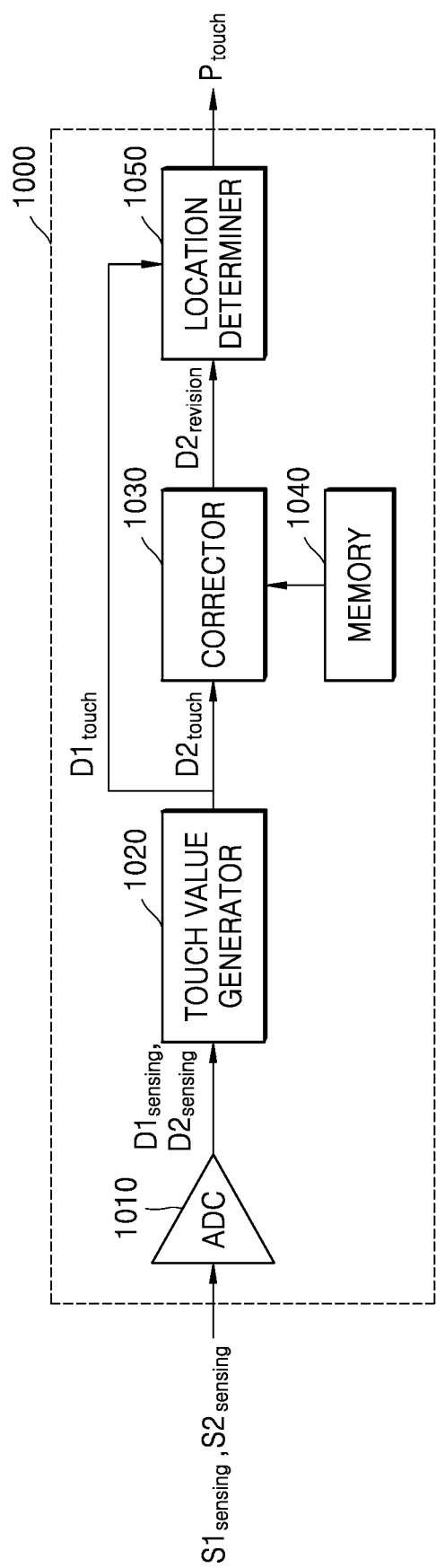
FIG. 10 is a conceptual diagram for describing a method of detecting a touch location, according to some embodiments.

FIG. 10 is a conceptual diagram for describing a method of detecting a touch location, according to some embodiments.

Referring to FIG. 10, a touch driving circuit 1000 may receive first sensing signals $S1_{sensing}$ and second sensing signals $S2_{sensing}$ according to a touch input and may determine a touch location $P_{touch}$.

The first sensing signals $S1_{sensing}$ may be transmitted from the first touch sensor TS1 (see FIG. 3) on the first display area DA1 (see FIG. 3), and the second sensing signals $S2_{sensing}$ may be transmitted from the second touch sensor TS2 (see FIG. 3) on the second display area DA2 (see FIG. 3). Each of the first sensing signals $S1_{sensing}$ and the second sensing signals $S2_{sensing}$ may include a signal component and a noise component.

The touch driving circuit 1000 may include an analog-to-digital converter (ADC) circuit 1010, a touch value generator 1020, a corrector 1030, a memory 1040, and a location determiner 1050.

The ADC circuit 1010 may generate first sensing values $D1_{sensing}$ by performing analog-to-digital conversion on the first sensing signals $S1_{sensing}$ and generate second sensing values $D2_{sensing}$ by performing analog-to-digital conversion on the second sensing signals $S2_{sensing}$. The first sensing signals $S1_{sensing}$ may be accumulated for a sampling cycle (e.g., a set or predetermined sampling cycle) before the analog-to-digital conversion. Likewise, the second sensing signals $S2_{sensing}$ may be accumulated for a sampling cycle (e.g., a set or predetermined sampling cycle) before the analog-to-digital conversion.

The touch value generator 1020 may generate first touch values $D1_{touch}$ based on the first sensing values $D1_{sensing}$ transmitted from the ADC circuit 1010 and second touch values $D2_{touch}$ based on the second sensing values $D2_{sensing}$ transmitted from the ADC circuit 1010. According to some embodiments, the first touch values $D1_{touch}$ may correspond to the signal component of the first sensing signals $S1_{sensing}$, and the second touch values $D2_{touch}$ may correspond to the signal component of the second sensing signals $S2_{sensing}$. According to some embodiments, the first touch values $D1_{touch}$ may correspond to a signal-to-noise ratio (SNR) of the first sensing signals $S1_{sensing}$, and the second touch values $D2_{touch}$ may correspond to an SNR of the second sensing signals $S2_{sensing}$.

The corrector 1030 may generate corrected touch values $D2_{revision}$ by correcting the second touch values $D2_{touch}$ transmitted from the touch value generator 1020.

The corrected touch values $D2_{revision}$ may be generated by multiplying each of the second touch values $D2_{touch}$ by a correction coefficient. The correction coefficients may be stored in the memory 1040. For example, the memory 1040 may include a lookup table (LUT), and the correction coefficients may be recorded in the LUT.

As described with reference to FIG. 9, due to the component area CA, the touch sensors TS may have different capacitances according to a location. The second touch values $D2_{touch}$ generated based on the second sensing signals $S2_{sensing}$ transmitted from the second touch sensors TS2 located in the second display area DA2 including the component area CA may be corrected by the corrector 1030. The corrected touch values $D2_{revision}$ may be values corrected to be similar to the first touch values $D1_{touch}$ generated based on the first sensing signals $S1_{sensing}$ transmitted from the first touch sensors TS1 located in the first display area DA1.

According to some embodiments, the correction coefficients may be determined as a ratio of a first reference touch value to second reference touch values. Here, the first reference touch value may be determined based on the first touch values $D1_{touch}$ when the reference touch input Tref (see FIG. 3) is applied to the first touch sensors TS1. The second reference touch values may correspond to the second touch values $D2_{touch}$ when the same reference touch input Tref is applied to the second touch sensors TS2. For example, as illustrated in FIG. 3, the reference touch input Tref may be applied to each of the second touch sensor TS2 in region A and the first touch sensor TS1 in region B. The second touch value $D2_{touch}$ generated based on the second sensing signal $S2_{sensing}$ transmitted from the second touch sensor TS2 in region A when the reference touch input Tref is applied, may correspond to the second reference touch values. The first touch value $D1_{touch}$ generated based on the first sensing signal $S1_{sensing}$ transmitted from the first touch sensor TS1 in region B when the reference touch input Tref is applied, may correspond to the first reference touch value. The correction coefficients may be determined based on the first reference touch value and the second reference touch values.

According to some embodiments, the second reference touch values may be less than the first reference touch value. For example, as illustrated in FIG. 3, the reference touch input Tref may be applied to each of the second touch sensor TS2 in region A and the first touch sensor TS1 in region B. Because the second touch sensor TS2 in region A may be located in the component area CA, a capacitance of the second touch sensor TS2 in region A may be relatively less than a capacitance of the first touch sensor TS1 in region B. An average level of the second sensing signal $S2_{sensing}$ transmitted from the second touch sensor TS2 in region A when the reference touch input Tref is applied may be less than an average level of the first sensing signal $S1_{sensing}$ transmitted from the first touch sensor TS1 in region B when the reference touch input Tref is applied. Thus, the second touch value $D2_{touch}$ generated based on the second sensing signal $S2_{sensing}$ may be less than the first touch value $D1_{touch}$ generated based on the first sensing signal $S1_{sensing}$. Because the second reference touch values may correspond to the second touch value $D2_{touch}$ and the first reference touch value may correspond to the first touch value $D1_{touch}$, the second reference touch values may be less than the first reference touch value.

According to some embodiments, the correction coefficients may vary according to locations of the second touch sensors TS2. For example, as described with reference to FIG. 9, both of the second touch sensor TS2 in region A and the second touch sensor TS2 in region C are located in the second display area DA2. However, the capacitance of the second touch sensor TS2 in region A may be less than the capacitance of the second touch sensor TS2 in region C. The second touch sensors TS2 may have different capacitances, according to a degree by which the sensing electrodes adjacent to the second touch sensors TS2 overlap the component area CA. Because the second touch sensors TS2 may have different capacitances according to locations of the second touch sensors TS2, the correction coefficients may be different from each other according to the locations of the second touch sensors TS2. The correction coefficients varying according to the locations of the second touch sensors TS2 may be stored in the memory 1040.

The location determiner 1050 may determine the touch location $P_{touch}$ based on the first touch values $D1_{touch}$ and the corrected touch values $D2_{revision}$.

For example, the location determiner 1050 may determine the touch location $P_{touch}$ based on the first touch values $D1_{touch}$, location values of the first touch sensors TS1, respectively corresponding to the first touch values $D1_{touch}$, the corrected touch values $D2_{revision}$, and location values of the second touch sensors TS2, respectively corresponding to the corrected touch values $D2_{revision}$.

According to some embodiments, when determining the touch location $P_{touch}$, a centroid method may be used. For example, the touch location $P_{touch}$ may be determined by using the first touch values $D1_{touch}$ and the corrected touch values $D2_{revision}$ as weight values, by which the location values of the first touch sensors TS1 and the location values of the second touch sensors TS2 are multiplied. The touch location $P_{touch}$ may be determined to be adjacent to a location of the touch sensor TS corresponding to the greatest touch value from among the first touch values $D1_{touch}$ and the corrected touch values $D2_{revision}$.

According to the method of detecting the touch location, according to some embodiments, the corrected touch values $D2_{revision}$ may be generated by multiplying each of the second touch values $D2_{touch}$ by the correction coefficients, and the touch location $P_{touch}$ may be determined based on the first touch values $D1_{touch}$ and the corrected touch values $D2_{revision}$. In this case, a value that is less than a predicted signal value, due to a difference of the metal areas of the sensing electrodes, may be corrected, and thus, a location in which a touch event occurs may be relatively more accurately determined.

Figure 11:
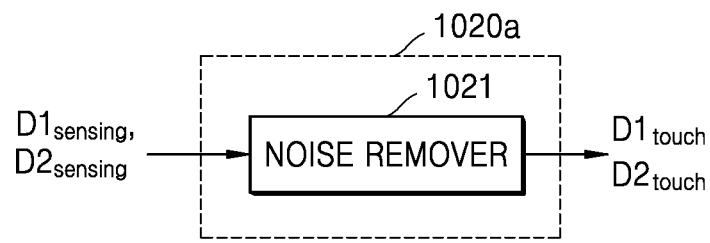
FIG. 11 is a conceptual diagram for describing a method of detecting a touch location, according to some embodiments.

FIG. 11 is a conceptual diagram for describing a method of detecting a touch location, according to some embodiments. For example, FIG. 11 corresponds to a modification of the embodiments described with respect to FIG. 10, and differs from FIG. 10 in terms of a touch value generator 1020*a*. Thus, descriptions will be given focusing on the difference.

Referring to FIG. 11, the touch value generator 1020*a* may include a noise remover 1021.

Each of the first sensing signals $S1_{sensing}$ and the second sensing signals $S2_{sensing}$ may include a signal component and a noise component. The first sensing values $D1_{sensing}$ generated by performing analog-to-digital conversion on the first sensing signals $S1_{sensing}$ may include the signal component and the noise component of the first sensing signals $S1_{sensing}$. The second sensing values $D2_{sensing}$ generated by performing analog-to-digital conversion on the second sensing signals $S2_{sensing}$ may include the signal component and the noise component of the second sensing signals $S2_{sensing}$.

According to some embodiments, the touch value generator 1020*a* may generate the first touch values $D1_{touch}$ corresponding to the signal component of the first sensing signals $S1_{sensing}$ by applying the noise remover 1021 to the first sensing values $D1_{sensing}$. Also, the touch value generator 1020*a* may generate the second touch values $D2_{touch}$ corresponding to the signal component of the second sensing signals $S2_{sensing}$ by applying the noise remover 1021 to the second sensing values $D2_{sensing}$.

Thus, the first touch values $D1_{touch}$ may correspond to the signal component of the first sensing signals $S1_{sensing}$, and the second touch values $D2_{touch}$ may correspond to the signal component of the second sensing signals $S2_{sensing}$.

Figure 12:
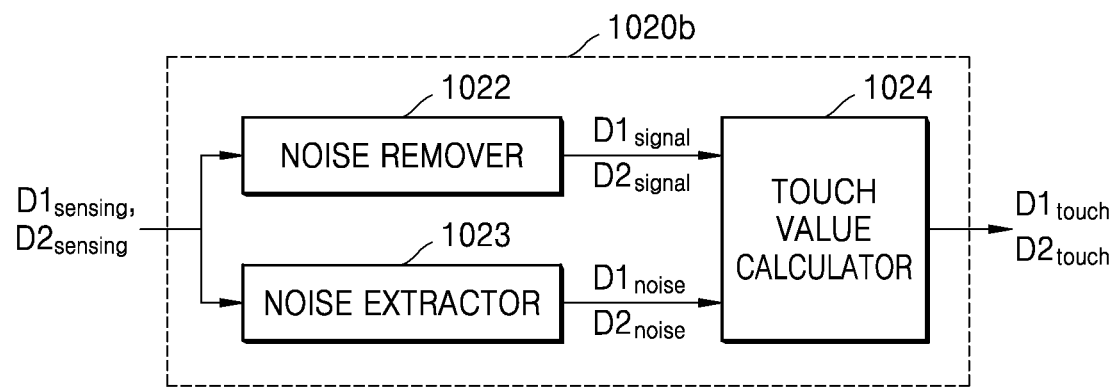
FIG. 12 is a conceptual diagram for describing a method of detecting a touch location, according to some embodiments.

FIG. 12 is a conceptual diagram for describing a method of detecting a touch location, according to some embodiments. For example, FIG. 12 corresponds to a partial modification of the embodiments described with respect to FIG. 10, and differs from FIG. 10 in terms of a touch value generator 1020*b*. Thus, descriptions will be given focusing on the difference.

Referring to FIG. 12, the touch value generator 1020*b* may include a noise remover 1022, a noise extractor 1023, and a touch value calculator 1024.

Each of the first sensing signals $S1_{sensing}$ and the second sensing signals $S2_{sensing}$ may include a signal component and a noise component. The first sensing values $D1_{sensing}$ generated by performing analog-to-digital conversion on the first sensing signals $S1_{sensing}$ may include the signal component and the noise component of the first sensing signals $S1_{sensing}$. The second sensing values $D2_{sensing}$ generated by performing analog-to-digital conversion on the second sensing signals $S2_{sensing}$ may include the signal component and the noise component of the second sensing signals $S2_{sensing}$.

The noise remover 1022 may generate the first signal values $D1_{signal}$ corresponding to the signal component of the first sensing signals $S1_{sensing}$ by removing a value corresponding to the noise component of the first sensing signals $S1_{sensing}$ from the first sensing values $D1_{sensing}$. Also, the noise remover 1022 may generate the second signal values $D2_{signal}$ corresponding to the signal component of the second sensing signals $S2_{sensing}$ by removing a value corresponding to the noise component of the second sensing signals $S2_{sensing}$ from the second sensing values $D2_{sensing}$.

The noise extractor 1023 may extract first noise values $D1_{noise}$ corresponding to the noise component of the first sensing signals $S1_{sensing}$ from the first sensing values $D1_{sensing}$. The noise extractor 1023 may extract second noise values $D2_{noise}$ corresponding to the noise component of the second sensing signals $S2_{sensing}$ from the second sensing values $D2_{sensing}$.

For example, the noise extractor 1023 may replace a noise component of sensing signals transmitted from touch sensors located in a region in which a touch event does not occur by a noise component of sensing signal transmitted from touch sensors located in a region in which a touch event occurs. That is, the noise component of the sensing signals transmitted from the touch sensors located in the region in which the touch event occurs may be derived from the noise component of the sensing signals transmitted from the touch sensors located in the region in which the touch event does not occur. Here, the noise component of the sensing signals transmitted from the touch sensors located in the region in which the touch event does not occur may be extracted from a previous frame.

Next, the touch value calculator 1024 may generate the first touch values $D1_{touch}$ based on a ratio of the first signal values $D1_{signal}$ to the first noise values $D1_{noise}$ and generate the second touch values $D2_{touch}$ based on a ratio of the second signal values $D2_{signal}$ to the second noise values $D2_{noise}$.

Thus, the first touch values $D1_{touch}$ may correspond to an SNR of the first sensing signals $S1_{sensing}$, and the second touch values $D2_{touch}$ may correspond to an SNR of the second sensing signals $S2_{sensing}$.

As described above, according to the one or more of the above embodiments of the disclosure, the method of detecting the touch location and the display apparatus may be realized for decreasing an error of the touch location, which is determined when a touch event occurs in a region in which an optical device is arranged. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate having a first display area and a second display area; and
a touch driving circuit configured to:
receive first sensing signals of first touch sensors on the first display area;
receive second sensing signals of second touch sensors on the second display area;
generate first touch values based on the first sensing signals;
generate second touch values based on the second sensing signals;
generate corrected touch values by correcting the second touch values; and
determine a touch location based on the first touch values and the corrected touch values.

2. The display apparatus of claim 1, wherein the corrected touch values are generated by multiplying each of the second touch values by each of correction coefficients.

3. The display apparatus of claim 2, wherein the correction coefficients are determined as a ratio of a first reference touch value to second reference touch values,
the first reference touch value is determined based on the first touch values in response to a reference touch input being applied to the first touch sensors, and
the second reference touch values correspond to the second touch values in response to the reference touch input being applied to the second touch sensors.

4. The display apparatus of claim 3, wherein the second reference touch values are less than the first reference touch value.

5. The display apparatus of claim 2, wherein the touch driving circuit is further configured to store the correction coefficients which vary according to locations of the second touch sensors.

6. The display apparatus of claim 1, wherein the first touch sensors comprise a first touch capacitor having a first capacitance, and
the second touch sensors comprise a second touch capacitor having a second capacitance that is less than the first capacitance.

7. The display apparatus of claim 1, wherein the touch driving circuit is further configured to:
generate first sensing values by performing analog-to-digital conversion on the first sensing signals;
generate the first touch values based on the first sensing values;
generate second sensing values by performing analog-to-digital conversion on the second sensing signals; and
generate the second touch values based on the second sensing values.

8. The display apparatus of claim 7, wherein the first sensing values comprise a signal component and a noise component of the first sensing signals,
the second sensing values comprise a signal component and a noise component of the second sensing signals, and
the touch driving circuit is further configured to generate the first touch values corresponding to the signal component of the first sensing signals and the second touch values corresponding to the signal component of the second sensing signals by applying a noise filter to the first sensing values and the second sensing values.

9. The display apparatus of claim 7, wherein the touch driving circuit is further configured to:
generate first signal values corresponding to a signal component of the first sensing signals and second signal values corresponding to a signal component of the second sensing signals by applying a noise filter to the first sensing values and the second sensing values;
generate first noise values corresponding to a noise component of the first sensing signals and second noise values corresponding to a noise component of the second sensing signals by applying a noise extraction filter to the first sensing values and the second sensing values;
generate the first touch values based on a ratio of the first signal values to the first noise values; and
generate the second touch values based on a ratio of the second signal values to the second noise values.

10. The display apparatus of claim 1, wherein the first touch values correspond to a signal component of the first sensing signals, and
the second touch values correspond to a signal component of the second sensing signals.

11. The display apparatus of claim 1, wherein the first touch values correspond to a signal-to-noise ratio of the first sensing signals, and
the second touch values correspond to a signal-to-noise ratio of the second sensing signals.

12. The display apparatus of claim 1, further comprising:
a plurality of first sensing electrode lines each extending on the substrate in a first direction; and
a plurality of second sensing electrode lines each extending on the substrate in a second direction,
wherein each of the first and second touch sensors corresponds to a region in which the plurality of first sensing electrode lines and the plurality of second sensing electrode lines cross each other.

13. The display apparatus of claim 1, further comprising:
a plurality of first pixels at the first display area; and
a plurality of second pixels at the second display area, wherein a number of the first pixels per unit area is greater than a number of the second pixels per unit area.

14. The display apparatus of claim 1, wherein the second display area includes a plurality of transmission areas, and
the display apparatus further comprises an optical device configured to emit light through the plurality of transmission areas or receive light through the plurality of transmission areas.

15. The display apparatus of claim 1, wherein the touch driving circuit is further configured to determine, by using a centroid method, the touch location, based on the first touch values, location values of the first touch sensors, the corrected touch values, and location values of the second touch sensors, wherein the location values of the first touch sensors respectively correspond to the first touch values, and the location values of the second touch sensors respectively correspond to the corrected touch values.

16. A method of detecting a touch location, the method comprising:
receiving first sensing signals from first touch sensors at a first display area of a substrate, and receiving second sensing signals from second touch sensors at a second display area of the substrate;
generating first touch values based on the first sensing signals and generating second touch values based on the second sensing signals;
generating corrected touch values by correcting the second touch values; and
determining the touch location based on the first touch values and the corrected touch values.

17. The method of claim 16, wherein the generating of the corrected touch values includes generating the corrected touch values by multiplying each of the second touch values by each of correction coefficients,
wherein the correction coefficients are determined as a ratio of a first reference touch value to second reference touch values,
the first reference touch value is determined based on the first touch values in response to a reference touch input being applied to the first touch sensors, and
the second reference touch values correspond to the second touch values in response to the reference touch input being applied to the second touch sensors.

18. The method of claim 16, wherein the generating of the first and second touch values includes:
generating first sensing values by performing analog-to-digital conversion on the first sensing signals and generating second sensing values by performing analog-to-digital conversion on the second sensing signals; and
generating the first touch values corresponding to a signal component of the first sensing signals and the second touch values corresponding to a signal component of the second sensing signals by applying a noise filter to the first sensing values and the second sensing values.

19. The method of claim 16, wherein the generating of the first and second touch values includes:
generating first sensing values by performing analog-to-digital conversion on the first sensing signals, and generating second sensing values by performing analog-to-digital conversion on the second sensing signals;
generating first signal values corresponding to a signal component of the first sensing signals and second signal values corresponding to a signal component of the second sensing signals by applying a noise filter to the first sensing values and the second sensing values;
generating first noise values corresponding to a noise component of the first sensing signals and second noise values corresponding to a noise component of the second sensing signals by applying a noise extraction filter to the first sensing values and the second sensing values; and
generating the first touch values based on a ratio of the first signal values to the first noise values and generating the second touch values based on a ratio of the second signal values to the second noise values.

20. The method of claim 16, wherein the determining of the touch location includes determining, by using a centroid method, the touch location, based on the first touch values, location values of the first touch sensors, the corrected touch values, and location values of the second touch sensors, wherein the location values of the first touch sensors respectively correspond to the first touch values, and the location values of the second touch sensors respectively correspond to the corrected touch values.

* * * * *